United States Patent
Toriyama et al.

(10) Patent No.: US 9,997,570 B2
(45) Date of Patent: Jun. 12, 2018

(54) RESISTIVE MEMORY WITH VARYING DOPANT CONCENTRATION IN SELECT TRANSISTOR CHANNEL

(71) Applicant: TOSHIBA MEMORY CORPORATION, Minato-ku (JP)

(72) Inventors: Shuichi Toriyama, Yokohama (JP); Tomonori Kurosawa, Zama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/388,376

(22) Filed: Dec. 22, 2016

(65) Prior Publication Data

US 2017/0271405 A1 Sep. 21, 2017

(30) Foreign Application Priority Data

Mar. 17, 2016 (JP) .................................. 2016-053250

(51) Int. Cl.
*H01L 27/24* (2006.01)
*H01L 23/528* (2006.01)
(Continued)

(52) U.S. Cl.
CPC .......... *H01L 27/249* (2013.01); *H01L 23/528* (2013.01); *H01L 27/2436* (2013.01);
(Continued)

(58) Field of Classification Search
CPC .................................................. H01L 27/249
See application file for complete search history.

(56) References Cited

U.S. PATENT DOCUMENTS 8,891,277 B2  11/2014  Murooka
9,275,729 B2   3/2016  Ota et al.
(Continued)

FOREIGN PATENT DOCUMENTS

JP   2006-351781   12/2006
JP   2013-120618    6/2013
(Continued)

OTHER PUBLICATIONS

Katsuhiko Tanaka et al., "Practical FinFET Design Considering GIDL for LSTP (Low Standby Power) Devices", Electron Devices Meeting, IEDM Technical Digest, IEEE International , 2005, pp. 4.
(Continued)

*Primary Examiner* — Asok K Sarkar
*Assistant Examiner* — Grant Withers
(74) *Attorney, Agent, or Firm* — Oblon, McClelland, Maier & Neustadt, L.L.P.

(57) ABSTRACT

A nonvolatile semiconductor memory device according to one embodiment includes: a first wiring extending in a first direction as a longitudinal direction thereof; a second wiring extending in a second direction as a longitudinal direction thereof, the second direction intersecting with the first direction; a memory cell disposed at an intersection portion of the first wiring and the second wiring, the memory cell including a variable resistive element; a select transistor having one end connected to the second wiring; and a third wiring connected to the other end of the select transistor. A semiconductor layer included in the select transistor has a first impurity concentration at the second end. An impurity concentration of the semiconductor layer decrease to a second impurity concentration from the first impurity concentration as approaching to the first end from the second end.

3 Claims, 11 Drawing Sheets

(51) Int. Cl.
  *H01L 45/00* (2006.01)
  *H01L 29/10* (2006.01)

(52) U.S. Cl.
  CPC .......... *H01L 29/1033* (2013.01); *H01L 45/08* (2013.01); *H01L 45/1233* (2013.01); *H01L 45/146* (2013.01)

(56) References Cited

U.S. PATENT DOCUMENTS

| | | |
|---|---|---|
| 9,286,978 B2 | 3/2016 | Minemura et al. |
| 2014/0252454 A1 | 9/2014 | Rabkin et al. |
| 2015/0069320 A1 | 3/2015 | Rabkin et al. |
| 2016/0351722 A1* | 12/2016 | Zhou ................ H01L 29/78696 |

FOREIGN PATENT DOCUMENTS

| | | |
|---|---|---|
| JP | 2015-76118 | 4/2015 |
| JP | 2015-141726 | 8/2015 |

OTHER PUBLICATIONS

U.S. Appl. No. 15/066,410, filed Mar. 10, 2016, Shuichi Toriyama et al.

\* cited by examiner

RESISTIVE MEMORY WITH VARYING DOPANT CONCENTRATION IN SELECT TRANSISTOR CHANNEL

CROSS REFERENCE TO RELATED APPLICATIONS

This application is based on and claims the benefit of priority from prior Japanese Patent Application No. 2016-053250, filed on Mar. 17, 2016, the entire contents of which are incorporated herein by reference.

FIELD

Embodiments described herein relate generally to a semiconductor memory device.

BACKGROUND

Recently, semiconductor memory devices that use a variable resistive element as a memory cell has been proposed. The variable resistive element reversibly changes its resistance value. In such the semiconductor memory device, increasing an on-current that flows in a selected memory cell and reducing an off-current that flows in a non-selected memory cell, are required.

DETAILED DESCRIPTION

A nonvolatile semiconductor memory device according to one embodiment includes: a first wiring extending in a first direction as a longitudinal direction thereof; a second wiring extending in a second direction as a longitudinal direction thereof, the second direction intersecting with the first direction; a memory cell disposed at an intersection portion of the first wiring and the second wiring, the memory cell including a variable resistive element; a select transistor having one end connected to the second wiring; and a third wiring connected to the other end of the select transistor. The select transistor includes a semiconductor layer, a gate insulating film and a select gate line. The semiconductor layer includes impurities therein, and has a first end connected to the second wiring and a second end connected to the third wiring. The gate insulating film is disposed on a side surface of the semiconductor layer. The select gate line faces the semiconductor layer via the gate insulating film. The semiconductor layer has a first impurity concentration at the second end. An impurity concentration of the semiconductor layer decreases to a second impurity concentration from the first impurity concentration as approaching the first end.

Nonvolatile semiconductor memory devices according to embodiments will be described below with reference to the drawings.

[First Embodiment]
[Configuration]

Figure 1:
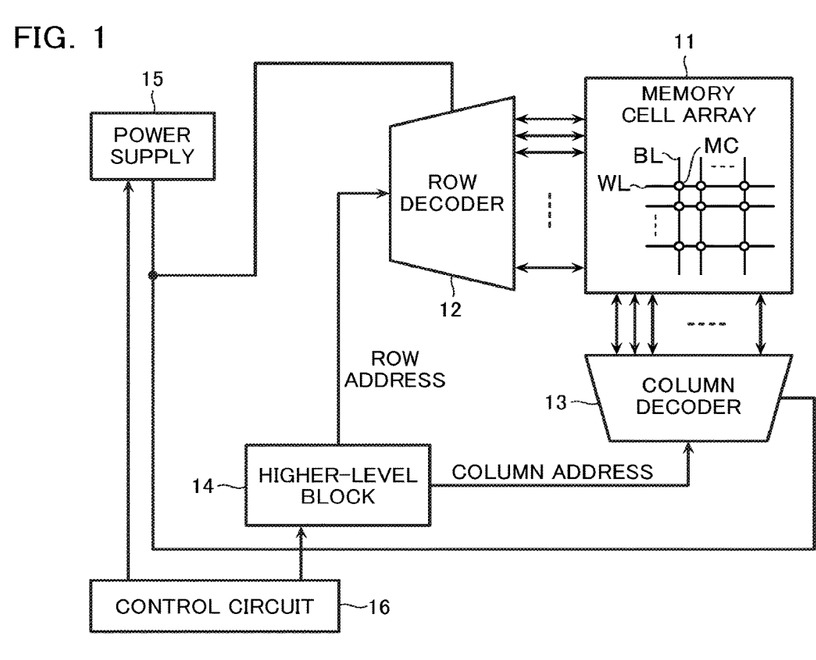
FIG. 1 is a block diagram showing an example of a semiconductor memory device according to a first embodiment.

First, an entire configuration of a semiconductor memory device according to a first embodiment will be described. FIG. 1 is a block diagram showing an example of a semiconductor memory device according to the first embodiment. As shown in FIG. 1, the semiconductor memory device includes a memory cell array 11, a row decoder 12, a column decoder 13, an upper block 14, a power supply 15, and a control circuit 16. The memory cell array 11 includes a plurality of word lines WL and bit lines BL, which intersect with one another. The memory cell array 11 also includes memory cells MC, which are disposed in the respective intersection portions of these lines. The row decoder 12 selects the word line WL for access (writing/reading). The column decoder 13 selects the bit line BL for access and includes a driver that controls an access operation.

The upper block 14 selects the memory cell MC to be accessed in the memory cell array 11. The upper block 14 gives a row address and a column address to the row decoder 12 and the column decoder 13, respectively. The power supply 15 generates combinations of certain voltages corresponding to respective operations of data erasure/writing/reading, and supplies the voltages to the row decoder 12 and the column decoder 13.

The control circuit 16 performs a control such as transmission of an address to the upper block 14 in response to an external command, and controls the power supply 15. In addition, the control circuit 16 may have a function that controls a voltage value and the like so as to make a current Icell (to be called "cell current" below) flowing in the memory cell MC smaller than a compliance current Icomp when performing a write operation such as a set operation and a reset operation. The control circuit 16 may have a function that performs an error detection/correction of data read from the memory cell array 11.

Figure 2:
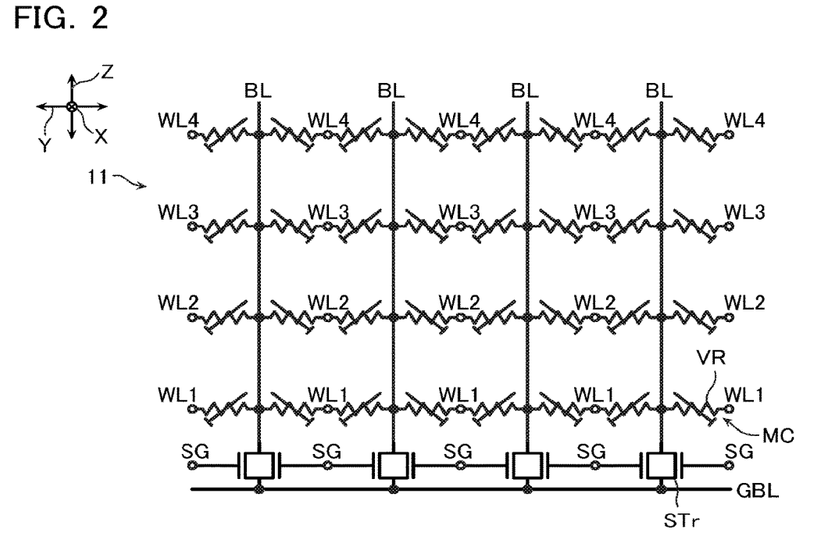
FIG. 2 is a circuit diagram showing an example of a memory cell array 11 according to the first embodiment.
Figure 3:
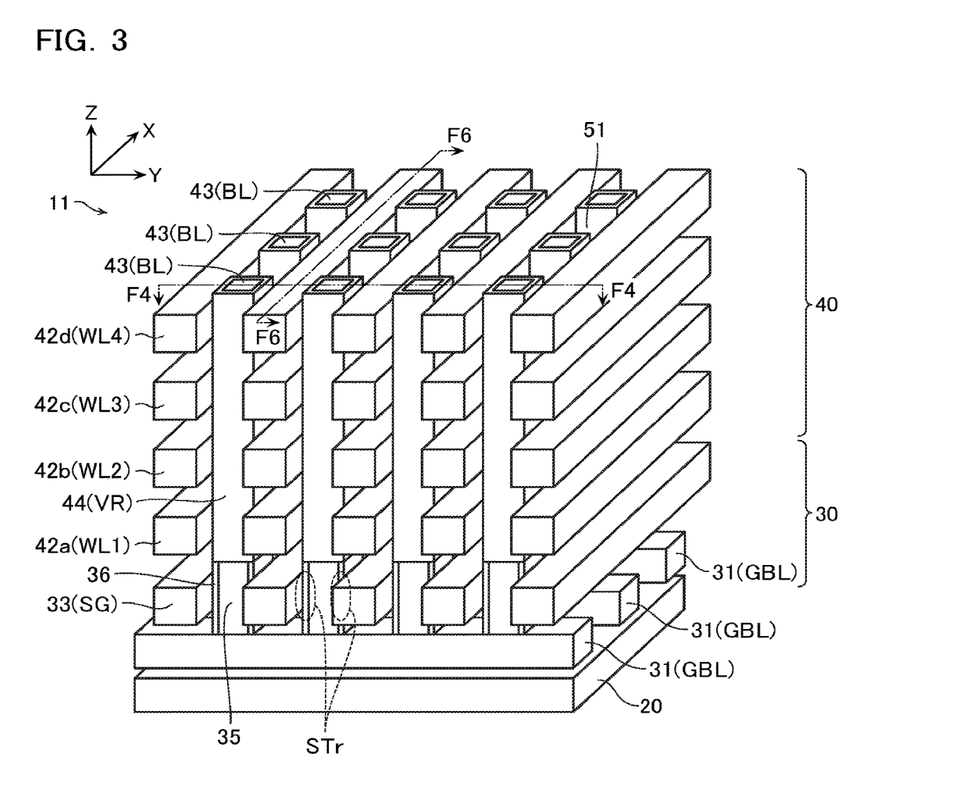
FIG. 3 is a perspective view showing an example of a laminated structure of the memory cell array 11.

Next, with reference to FIGS. 2 and 3, the memory cell array 11 according to the first embodiment will be described in detail. FIG. 2 is a circuit diagram showing an example of the memory cell array 11. FIG. 3 is a perspective view showing an example of a laminated structure of the memory cell array 11. Note that in FIG. 2, an X direction, a Y direction and a Z direction are orthogonal to one another. The X direction is a direction perpendicular to the paper surface. Further, a structure shown in FIG. 2 is repeatedly disposed in the X direction. Moreover, in FIG. 3, although interlayer insulating layers are formed between wirings in an actual device, an illustration of the interlayer insulating layers is omitted to simplify the illustration.

As shown in FIG. 2, the memory cell array 11 has select transistors STr, global bit lines GBL and select gate lines SG other than the word lines WL, the bit lines BL and the memory cells MC described above.

As shown in FIGS. 2 and 3, the word lines WL1 to WL4 are arranged in the Z direction at a certain pitch and are formed so as to extend in the X direction as a longitudinal direction thereof. The bit lines BL are arranged in a matrix in the X direction and the Y direction and are formed so as to extend in the Z direction as a longitudinal direction thereof. The memory cells MC are disposed at positions where the word lines WL and the bit lines BL intersect. Therefore, the memory cells MC are arranged in three-dimensionally matrix in the X direction, the Y direction and the Z direction in the memory cell array 11.

As shown in FIG. 2, the memory cell MC has a variable resistive element VR. The memory cell MC that includes the variable resistive element VR is electrically rewritable and stores nonvolatile data based on a resistance value given to the variable resistive element VR. The variable resistive element VR changes to a low resistive state (a set state) from a high resistive state (a reset state) by a set operation that applies a certain voltage or more to both ends thereof, and changes to the high resistive state (the reset state) from the low resistive state (the set state) by a reset operation that applies a certain voltage or more to both ends thereof.

Moreover, the variable resistive element VR is in a state that does not easily change the resistive state thereof immediately after manufacturing, and is in the high resistive state. Accordingly, a forming operation that applies a high voltage that is equal to or more than the voltage of the set operation and the reset operation to both ends of the variable resistive element VR is performed. According to this foaming operation, a region (a filament pass) where a current can easily flow locally in the variable resistive element VR is formed. Then, the variable resistive element VR can easily change the resistive state thereof and becomes a state capable of operating as a storage element.

As shown in FIG. 2, the select transistor STr in which one end thereof is connected to one end of the bit line BL, the other end thereof is connected to the global bit line GBL. The global bit lines GBL are arranged in the X direction at a certain pitch and formed so as to extend in the Y direction as a longitudinal direction thereof. One of the global bit lines GBL is commonly connected to one ends of the plurality of the select transistors STr arranged in a line in the Y direction. Moreover, two select transistors STr arranged adjacent in the Y direction are commonly connected to one gate electrode.

The select gate lines SG are arranged in the Y direction at a certain pitch and are formed so as to extend in the X direction as a longitudinal direction thereof. One of the select gate lines SG is commonly connected to gates of the plurality of the select transistors STr arranged in a line in the X direction. Note that, two select transistors STr may be independently operated, respectively, by separating the gate electrodes of the two select transistors STr arranged adjacent to each other in the Y direction.

Figure 4:
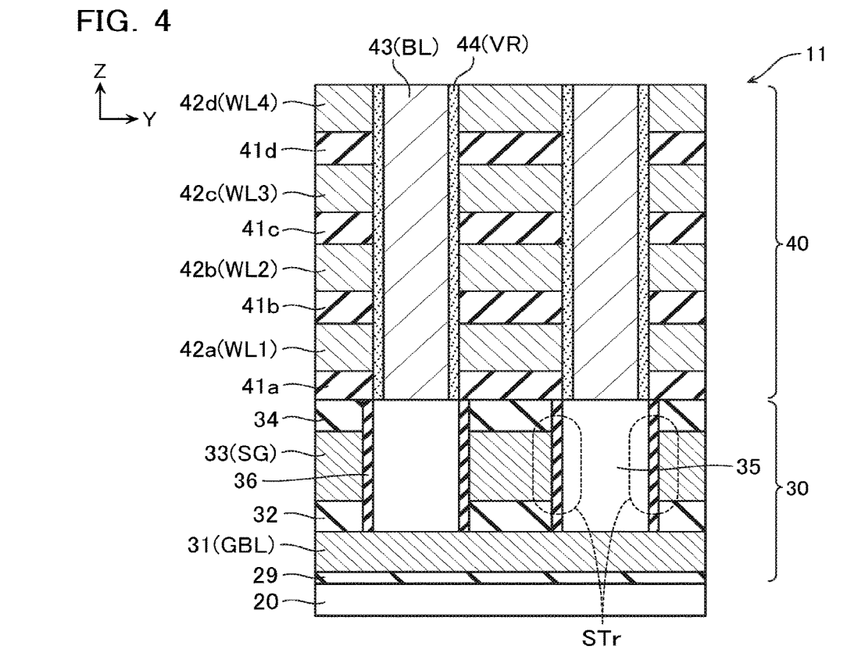
FIG. 4 is a cross-sectional view along line F4-F4 of FIG. 3.
Figure 5:
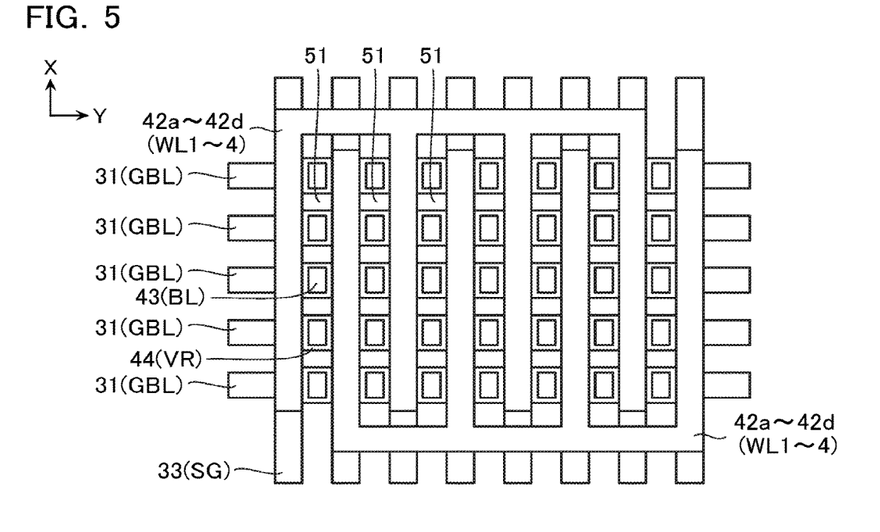
FIG. 5 is a top view of FIG. 3.

Next, with reference to FIG. 3, FIG. 4 and FIG. 5, the laminated structure of the memory cell array according to the first embodiment will be described. FIG. 4 is a cross-sectional view along line F4-F4 of FIG. 3. FIG. 5 is a top view of FIG. 3. Note that, an illustration of the interlayer insulating layers is omitted in FIG. 3 and FIG. 5.

As shown in FIG. 3 and FIG. 4, the memory cell array 11 has a select transistor layer 30 and a memory layer 40 that are laminated above a substrate 20. The select transistor layer 30 functions as the select transistors STr. The memory layer 40 functions as the memory cells MC.

As shown in FIG. 3 and FIG. 4, the select transistor layer 30 has conductive layers 31, an interlayer insulating layer 32, conductive layers 33 and an interlayer insulating layer 34. These conductive layers 31, the interlayer insulating layer 32, the conductive layers 33 and the interlayer insulating layer 34 are laminated in the Z direction perpendicular to the substrate 20. The conductive layers 31 function as the global bit lines GBL. The conductive layers 33 function as the select gate lines SG and gates of the select transistors STr. A selected select transistor STr becomes conductive when a positive voltage is applied to the select gate line SG, the selected select transistor STr set a corresponding memory cell MC to a selected state. At this time, a non-selected select transistor STr is set to a non-conductive state when a negative voltage is applied to the select gate line SG, thereby maintaining a corresponding memory cell MC at a non-selected state.

The conductive layers 31 are formed so as to be arranged parallel to the X direction at a certain pitch and so as to extend in the Y direction as longitudinal directions thereof, above the substrate via an interlayer insulating layer 29 (see FIG. 4). The interlayer insulating layer 32 covers upper surfaces of the conductive layers 31. The conductive layers 33 are formed so as to be arranged in the Y direction at a certain pitch and so as to extend in the X direction as longitudinal directions thereof (see FIG. 4). The interlayer insulating layer 34 covers upper surfaces of the conductive layers 33. The conductive layers 31 and 33 may be configured of polysilicon, for example. The interlayer insulating layers 32 and 34 may be configured of silicon oxide ($SiO_2$).

Moreover, as shown in FIG. 3 and FIG. 4, the select transistor layer 30 has columnar semiconductor layers 35 and gate insulating layers 36. The columnar semiconductor layer 35 functions as a body (a channel) of the select transistor STr. The gate insulating layer 36 functions as a gate insulating film of the select transistor STr.

The columnar semiconductor layer 35 is an n-type semiconductor that includes pentads such as phosphorus (P) or arsenic (As) as impurities. The columnar semiconductor layer 35 is disposed in a matrix in the X and Y direction and has columnar shape having a longitudinal direction in the Z direction. Further, the columnar semiconductor layer 35 connects to an upper surface of the conductive layer 31 and connects to a side surface in the Y direction of the conductive layer 33 via the gate insulating layer 36. The columnar semiconductor layer 35 is the n-type semiconductor in which an impurity concentration distribution described below according to donors (such as phosphorus) is given.

Note that in FIG. 3 and FIG. 4, an example in which the select transistor layer 30 is formed at a lower layer of the memory layer 40 is described. Instead of this, the select transistor layer 30 may be disposed at an upper layer of the memory layer 40. Namely, the select transistor STr may be connected to an upper end of the columnar semiconductor layer 43.

As shown in FIG. 3 and FIG. 4, the memory layer has interlayer insulating layers 41a to 41d and conductive layers 42a to 42d that are alternately laminated in the Z direction. The conductive layers 42a to 42d function as the word lines WL1 to WL4, respectively. The conductive layers 42a to 42d each have a pair of comb shapes facing in the X direction when viewed from the Z direction (see FIG. 5). The interlayer insulating layers 41a to 41d are configured by silicon oxide ($SiO_2$), for example. The conductive layers 42a to 42d are configured by polysilicon or titanium nitride (TiN), for example. Moreover, as shown in FIG. 3 and FIG. 4, the memory layer 40 has columnar conductive layers 43 and variable resistive layers 44. The columnar conductive layers 43 function as the bit lines BL. The variable resistive layer 44 is configured by a material such as hafnium oxide (HfOx), for example, and functions as the variable resistive element VR. Although a thickness of the variable resistive layer is about 5 nm, for example, the thickness thereof can be appropriately changed in the range of about 2 to 10 nm. Transition metal oxide of such as chromium (Cr), tungsten (W), vanadium (V), niobium (Nb), tantalum (Ta), titanium (Ti), zirconium (Zr), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), tin (Sn), lead (Pb), and bismuth (Bi), or oxides of so-called rare earth element from lanthanum (La) to lutetium (Lu) and the like can be used as the material other than hafnium oxide (HfOx).

The columnar conductive layers 43 are disposed in a matrix in the X and Y direction. The columnar conductive layer 43 connects an upper surface of the columnar semiconductor layer 35 at a lower end thereof and extends in a columnar shape in the Z direction. The variable resistive layer 44 is disposed at a side surface of the columnar conductive layer 43 and configures the memory cell MC described above. In the example shown in FIG. 5, the variable resistive layer 44 covers all circumference of the columnar conductive layer 43 and is formed in a closed loop. Namely, as shown in FIG. 4, the variable resistive layer 44 is disposed along both side surfaces in the Y direction of the columnar conductive layer 43 and also along both side surfaces in the X direction of the columnar conductive layer as shown in FIG. 5 (that is, the variable resistive layer 44 is also disposed at a position between the columnar conductive layer 43 and the interlayer insulating layer 51), thus the variable resistive layer 44 is formed in the closed loop so as to cover the all circumference of the columnar conductive layer 43. Note that, this is only an example, a configuration in which the variable resistive layer 44 is disposed at only the side surface in the Y direction of the columnar conductive layer 43 can be adopted.

Moreover, the variable resistive layer 44 is removed at least a part thereof at a position between a bottom surface of the columnar conductive layer 43 and the columnar semiconductor layer 35. According to this, the columnar conductive layer 43 and the columnar semiconductor layer 35 have portions that are directly connected with each other without via the variable resistive layer 44. The columnar conductive layer 43 is configured by a conductive material such as polysilicon, tungsten nitride (WN), tungsten (W), and ruthenium (Ru), for example, or a laminated body of a plurality of kinds of these conductive materials.

Figure 6:
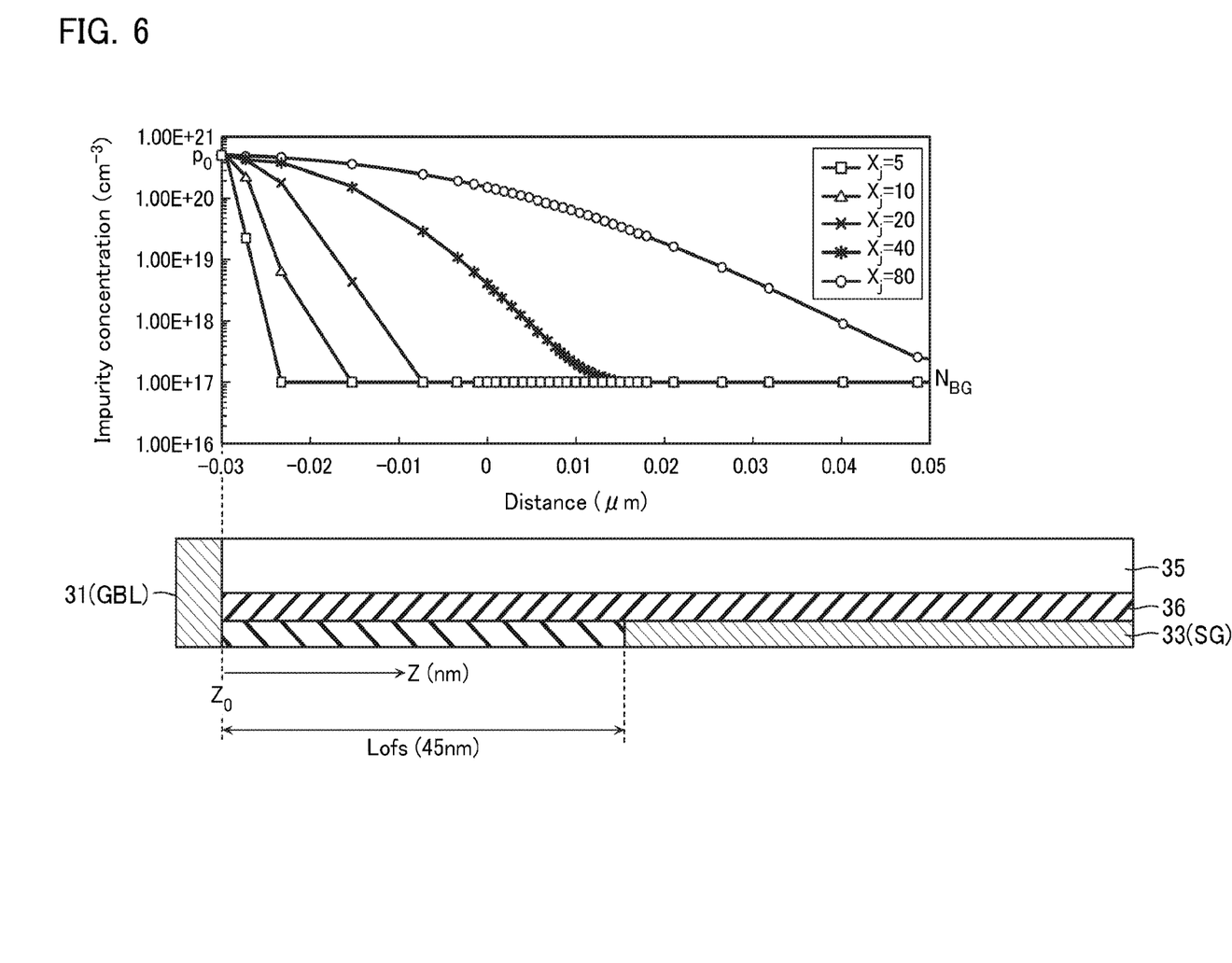
FIG. 6 is a graph showing an impurity concentration distribution of a columnar semiconductor layer of the first embodiment (When an offset distance Lofs=45 nm).
Figure 7:
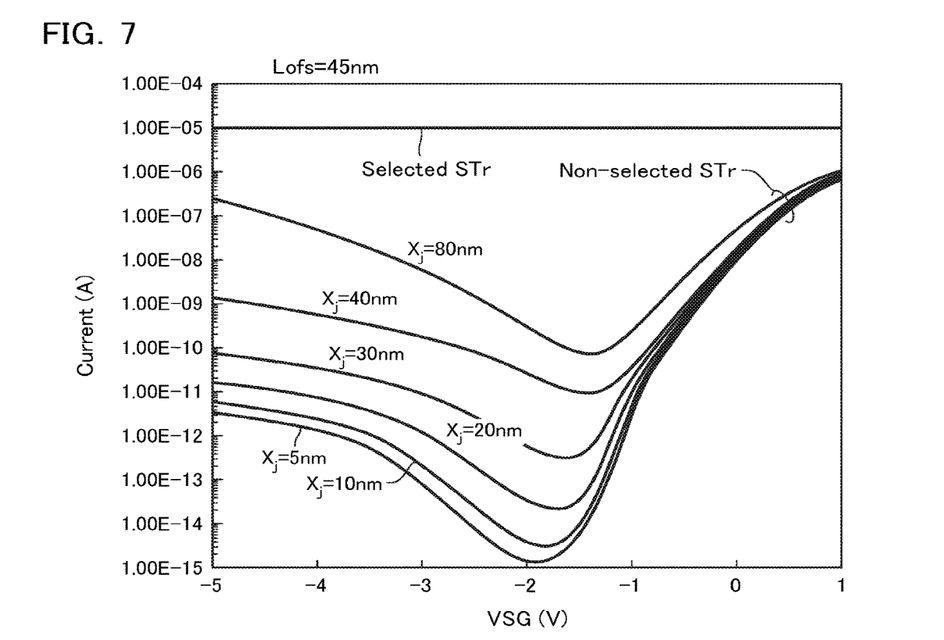
FIG. 7 is a graph showing a relationship between a value of a current that flows in a select transistor STr and a gate voltage VSG applied to a non-selected select transistor STr (When the offset distance Lofs=45 nm).

Next, with reference to FIG. 6 and FIG. 7, the impurity concentration distribution of the columnar semiconductor layer 35 will be described. FIG. 6 is a graph showing the impurity concentration distribution of the columnar semiconductor layer 35. FIG. 7 is a graph showing a relationship between a gate voltage VSG applied to the non-selected select transistor STr and a value of a current that flows in the select transistor STr. Note that, FIG. 6 shows a case that a distance in the Z direction from an upper end of the global bit line GBL to a lower end of the select gate line SG (hereinafter referred to as an offset distance Lofs) is set to 45 nm.

The select transistor STr needs to flow a large on-current Ion when selected, and needs to suppress an off-current Ioff when not selected. When a difference of magnitude (a margin) between the on-current Ion and the off-current Ioff is small, accurately determining data of the memory cell MC becomes difficult. However, as described above, when applying a negative gate voltage to the non-selected select transistor STr, a so-called GIDL (Gate Induced Drain Leakage) current is generated near the non-selected select transistor STr. Due to this, there is a problem that a leak characteristic of the non-selected select transistor STr deteriorates. Thereby, the difference between the on-current Ion that flows in the selected memory cell MC and the off-current Ioff that flows in the non-selected memory cell MC decreases. This makes it difficult to accurately read a stored data of the memory cell MC.

Therefore, in the semiconductor memory device of the embodiment, the impurity concentration distribution is set so that an impurity concentration p of impurities (such as phosphorus) included in the columnar semiconductor layer 35 is high at a global bit line GBL side, and decreases as approaching a bit line BL side. For example, the impurity concentration ρ at an end portion of the columnar semiconductor layer 35 of the global bit line GBL side is set to $5\times10^{19}$ [$cm^{-3}$] or more, and the impurity concentration ρ at a position at least 30 nm far from the end portion to the bit line BL side is set to one hundredth or less of $5\times10^{19}$ [$cm^{-3}$]. According to this, ohmic contact between the global bit line GBL and the columnar semiconductor layer 35 is maintained, the GIDL current is effectively controlled, and the leak characteristic can be favorably maintained.

More specifically, an impurity concentration ρ(Z) of the columnar semiconductor layer 35 at a position that is at a distance Z from the end portion of the columnar semiconductor layer 35 of the global bit line GBL side is represented by a formula (1) below. Here, ρo is the impurity concentration of the end portion of the columnar semiconductor layer 35 of the global bit line GBL side, and Zo is a Z-axis coordinate value of the end portion of the columnar semiconductor layer 35 of the global bit line GBL side, $x_j$ is an attenuation constant. $N_{BG}$ is the impurity concentration after attenuation of the columnar semiconductor layer 35 at the bit line BL side. In other words, $N_{BG}$ means a concentration of unintended background donor in the columnar semiconductor layer 35. Note that, FIG. 6 is the graph showing a case that ρo is set to $5\times10^{20}$ [$cm^{-3}$] and $N_{BG}$ is set to $1\times10^{17}$ [$cm^{-3}$].

$$\rho(Z) = \rho o \cdot \exp\left\{\frac{-(Z-Zo)^2}{A^2}\right\} \quad (1)$$

Here, A is a constant shown as the next formula (2). Moreover, the impurity concentration ρ(Z) is set to $N_{BG}$ as a minimum value.

$$A = \sqrt{\frac{x_j^2}{2\log(\rho o/N_{BG})}} \quad (2)$$

When the formula (2) is substituted in A in the formula (1), and it is considered that the impurity concentration ρ(Z) is set having $N_{BG}$ as its minimum value, a formula (3) shown below is obtained.

$$\rho = \max\left[\rho o \cdot \exp\left(-\frac{\log\left(\frac{\rho o}{N_{BG}}\right)^2 (Z-Zo)^2}{x_j^2}\right), N_{BG}\right] \quad (3)$$

As shown in FIG. 6, when the attenuation constant $x_j$ is changed, attenuation degree of an attenuation curve of the impurity concentration distribution of the columnar semiconductor layer 35 may be changed. When $x_j$ is set to a value less than 40, the impurity concentration at the position that is distant from the global bit line GBL by 30 nm can be one hundredth or less compared with the end portion of the global bit line GBL side.

In addition, as shown in FIG. 7, when the gate voltage VSG applied to the non-selected select transistor STr is set to a negative value, such as about −2 V, the off-current Ioff that flows in the non-selected select transistor STr can be minimized (the gate voltage VSG that minimize the off-current Ioff is different according to a value of $x_j$). Note that, when the gate voltage VSG is a negative value but when an absolute value of the gate voltage VSG is large, the GIDL current contrarily increases, and the off-current Ioff increases.

Figure 8:
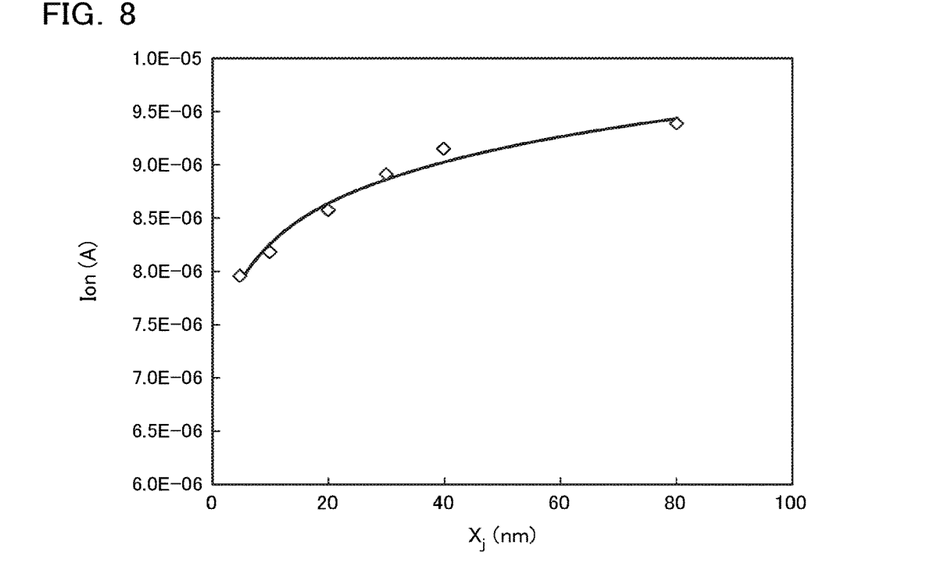
FIG. 8 is a graph showing a relationship between an attenuation constant $x_j$ and an on-current Ion that flows in a selected select transistor STr (When the offset distance Lofs=45 nm).

Moreover, as shown in FIG. 7, as the attenuation constant $x_j$ is smaller, the off-current Ioff of the non-selected select transistor STr can be smaller. When an upper limit value of the off-current Ioff acceptable in one select transistor STr is $1\times10^{-11}$ [A], for example, the attenuation constant $x_j$ is preferably set to $x_j \leq 40$. However, because the ohmic contact between the global bit line GBL and the columnar semiconductor layer 35 cannot be obtained when the attenuation constant $x_j$ is smaller than 5 [nm], the attenuation constant $x_j$ is preferably set to $x_j \geq 5$. Note that, as shown in FIG. 8, the smaller the attenuation constant x is, the more the on-current Ion in the selected memory cell MC decreases. Therefore, $x_j$ value is desirably decided to an optimal value with considering an obtained value of the on-current Ion and the upper limit value of the off-current Ioff.

Graphs of FIG. 6 and FIG. 7 that are described above show the case that the offset distance Lofs is set to 45 nm.

Figure 9:
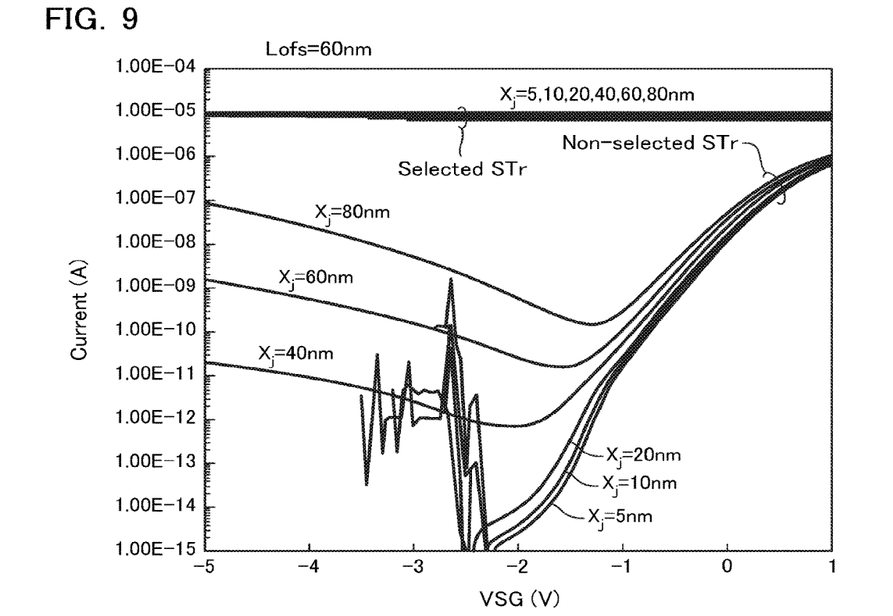
FIG. 9 is a graph showing a relationship between the value of the current that flows in the select transistor STr and the gate voltage VSG applied to the non-selected select transistor STr (When the offset distance Lofs=60 nm).
Figure 10:
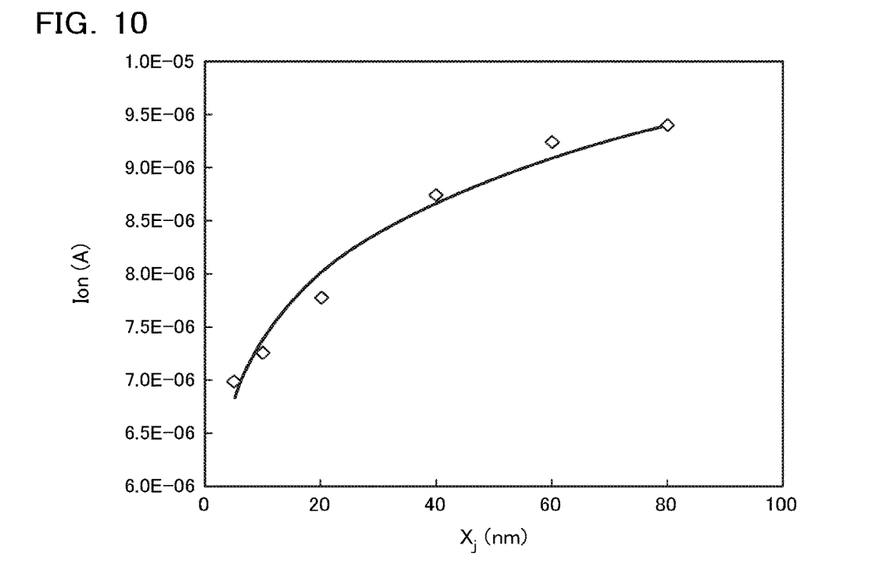
FIG. 10 is a graph showing a relationship between the attenuation constant $x_j$ and the on-current Ion that flows in the selected select transistor STr (When the offset distance Lofs=60 nm).

FIG. 9 and FIG. 10 are graphs showing a case that the offset distance Lofs is set to 60 nm. As shown in FIG. 9, when the offset distance Lofs=60 nm, a current that flows in the non-selected select transistor STr has its minimum value when the gate voltage VSG is about −2 V, regardless of the value of $x_j$. Note that, when the value of $x_j$ is smaller than ($x_j$=20, 10 or 5, for example), and when the gate voltage VSG is smaller than −2 V, it has been confirmed that the current that flows in the non-selected select transistor STr does not converge, but the current oscillates about a certain voltage value (the current that flows in the non-selected select transistor STr is greatly changed by a slight change of the gate voltage VSG). Moreover, as shown in FIG. 10, it has been confirmed that the on-current Ion at the selected select transistor STr greatly decreases when $x_j$ decreases to less than 40. The rate of decrease is significant compared with the case that the offset distance Lofs is 45 nm.

Figure 11:
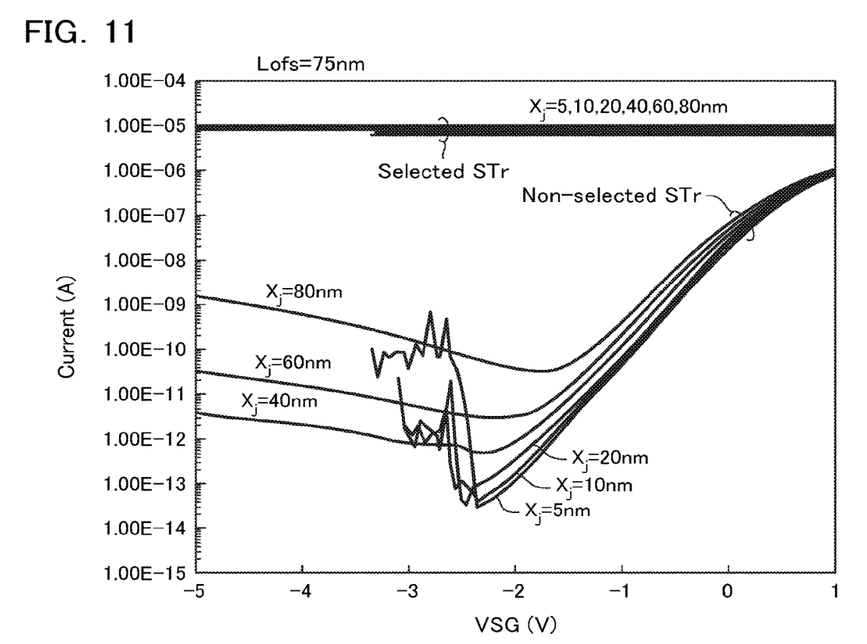
FIG. 11 is a graph showing a relationship between the gate voltage VSG applied to the non-selected select transistor STr and the value of the current that flows in the select transistor STr (When the offset distance Lofs=75 nm).
Figure 12:
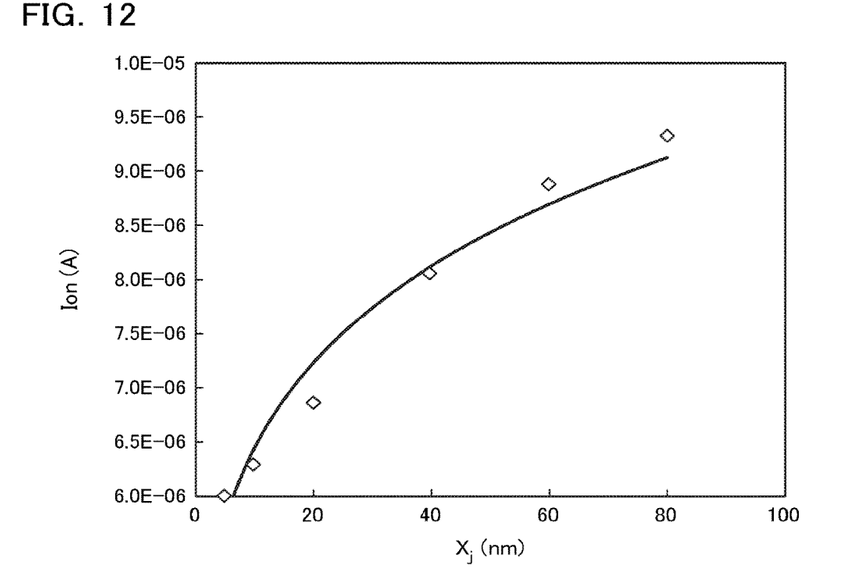
FIG. 12 is a graph showing a relationship between the attenuation constant $x_j$ and the on-current Ion that flows in the selected select transistor STr (When the offset distance Lofs=75 nm).

FIG. 11 and FIG. 12 are graphs showing a case that the offset distance Lofs is set to 75 nm. As shown in FIG. 11, when the Lofs=75 nm, it has been confirmed that the current that flows in the non-selected select transistor STr is minimized when the gate voltage VSG is about −2 V, regardless of the value of $x_j$. When $x_j$ is less than 40 and the gate voltage VSG is less than −2 V, the current that flows in the non-selected select transistor STr does not converge but oscillates about a certain voltage value. In addition, as shown in FIG. 12, it has been confirmed that the on-current Ion at the selected select transistor STr greatly decreases when $x_j$ decreased to less than 40, and the rate of decrease is further significant compared with the case that the offset distance Lofs is 60 nm.

From the result explained above, the offset distance Lofs is preferably set as short as possible. Moreover, it is preferable that the value of $x_j$ is set in a range that can obtain an optimal on-current Ion and an optimal off-current Ioff according to the determined offset distance Lofs.

As described above, in this first embodiment, the impurity concentration distribution of the columnar semiconductor layer 35 in the select transistor STr is set to as described above. According to this, the on-current that flows in the selected memory cell can be increased while the off-current that flows in the non-selected memory cell can be decreased.

[Second Embodiment]

Next, a semiconductor memory device according to a second embodiment will be described with reference to FIGS. 13 to 17.

A schematic configuration of the semiconductor memory device of the second embodiment is similar to the first embodiment (FIG. 1), but a configuration of the memory cell array is different from that of the first embodiment. Note that, component elements identical to the memory cell array of the first embodiment are assigned with reference symbols identical to those assigned in the first embodiment in FIGS. 13 to 17.

Figure 13:
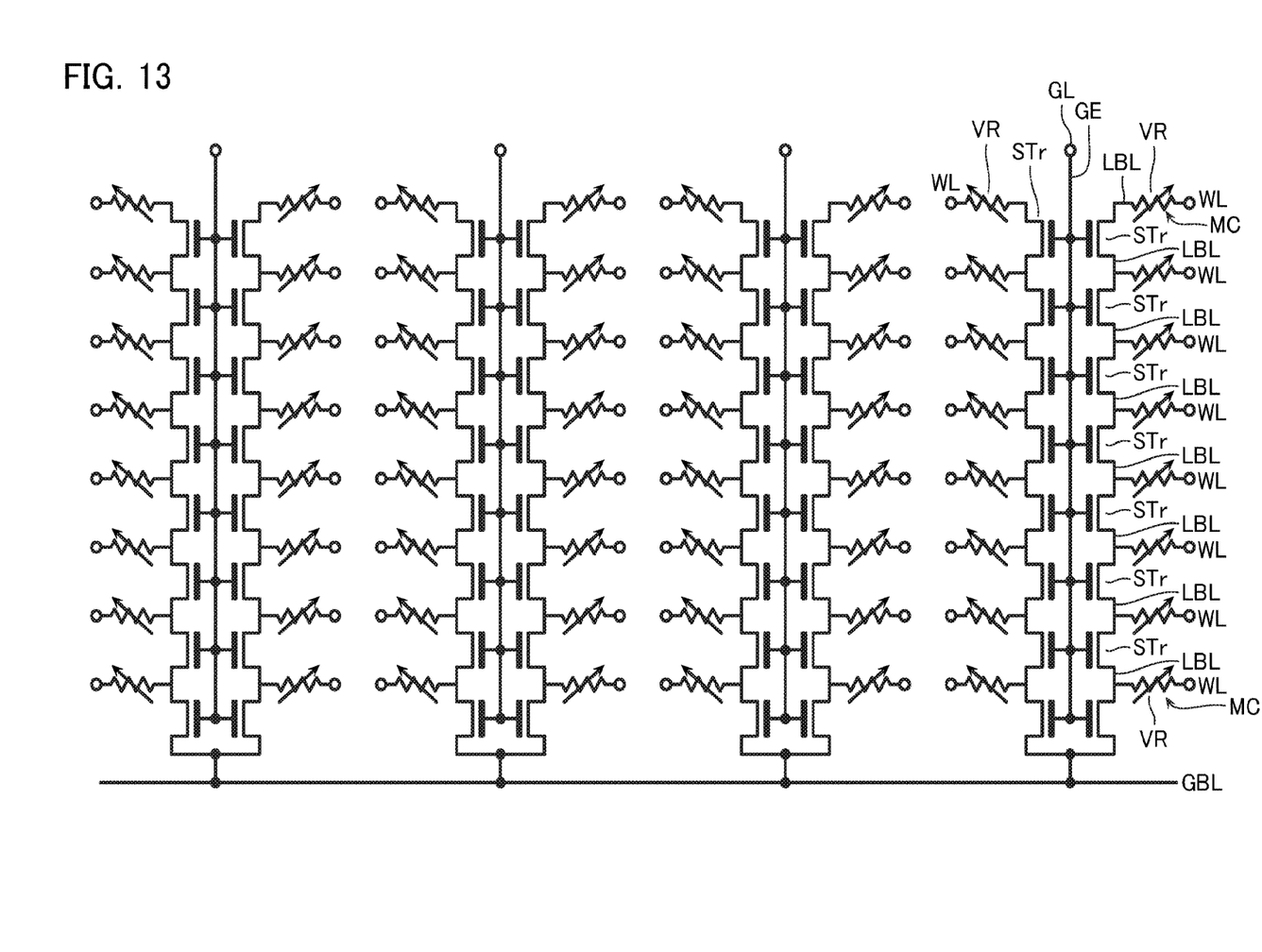
FIG. 13 is a circuit diagram showing an example of a memory cell array 11 according to a second embodiment.

As shown in FIG. 13, in the memory cell array of the second embodiment, the plurality of memory cells MC are disposed at intersections of the word lines WL and local bit lines LBL. The local bit line LBL has the plurality of the select transistors STr connected in series. In addition, the select transistor STr has a gate electrode GE connected to a gate thereof, the gate electrode GE is connected to a gate line GL. Note that, the nonvolatile semiconductor memory device of this embodiment has a structure that a plurality of structures shown in FIG. 13 is disposed in a horizontal direction on the paper and a perpendicular direction on the paper.

The memory cell MC includes the variable resistive element VR. The variable resistive element VR is electrically rewritable and stores nonvolatile data based on a resistance value.

When accessing one selected memory cell MC, the local bit line LBL connected to the selected memory cell MC is selected by the column decoder 13. That is, a certain voltage is applied to the gate line GL corresponding to the selected local bit line LBL. At the same time, the global bit line GBL corresponding to the selected memory cell MC is applied with a voltage whose value is different from the voltage applied to the gate line GL. This causes an inversion layer to be generated in the local bit line LBL due to a potential difference between the gate electrode GE that is electrically connected to the gate line GL and the global bit line GBL. According to this, a channel (a current pass) is formed in the local bit line LBL. Namely, the select transistor STr shown in FIG. 13 becomes a conductive state.

As described above, in the nonvolatile semiconductor memory device of this embodiment, the select transistor STr is configured by the gate electrode GE, the local bit line LBL and a gate insulating film (described below and not shown in FIG. 13) that lies between the gate electrode GE and the local bit line LBL. That is, the gate electrode GE functions as a gate of the select transistor STr, and the local bit line LBL functions as the channel of the select transistor STr. Then, by applying a certain voltage to the word line WL connected to the selected memory cell MC, a current flows due to the potential difference between the word line WL and the global bit line GBL, the memory cell MC can be accessed. Moreover, the non-selected memory cell MC by applying the certain voltage to the word line WL connected to the non-selected memory cell MC.

Figure 14:
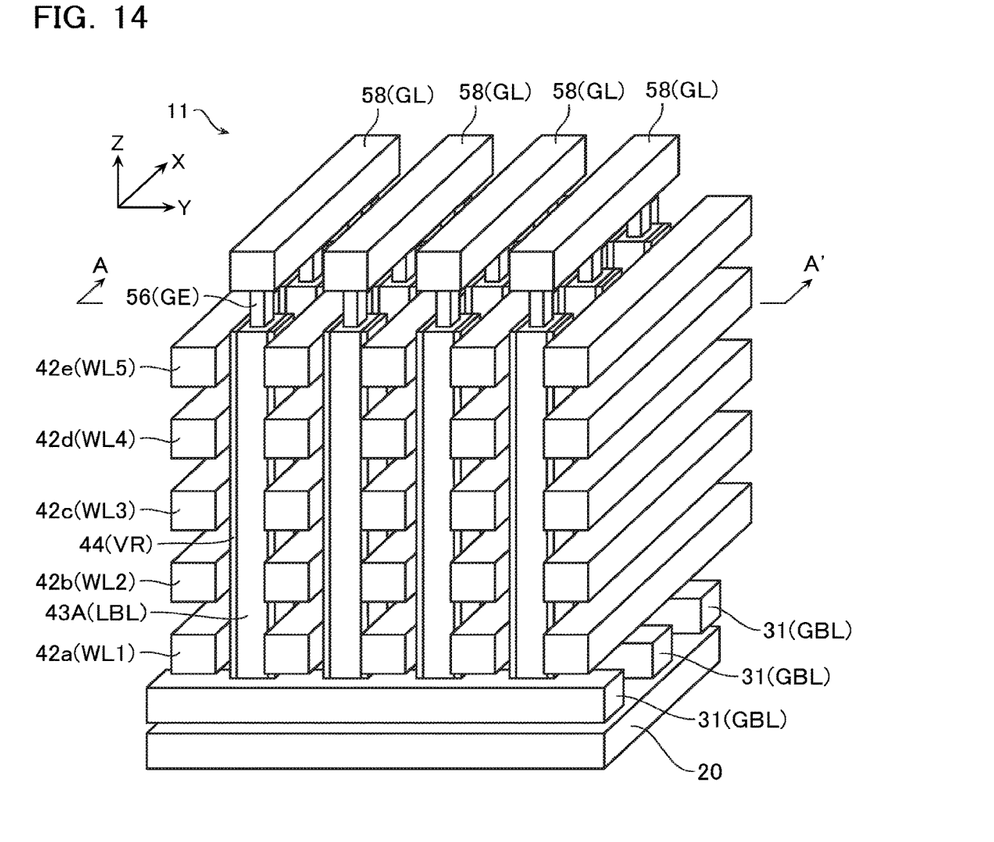
FIG. 14 is a perspective view showing an example of a laminated structure of the memory cell array 11 according to the second embodiment.
Figure 15:
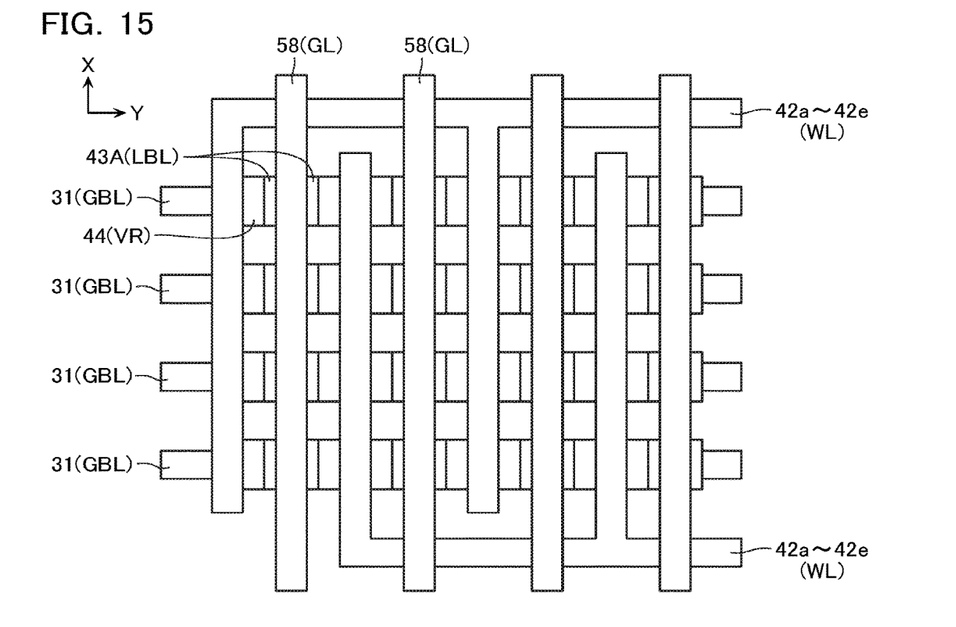
FIG. 15 is a top view of FIG. 14.
Figure 16:
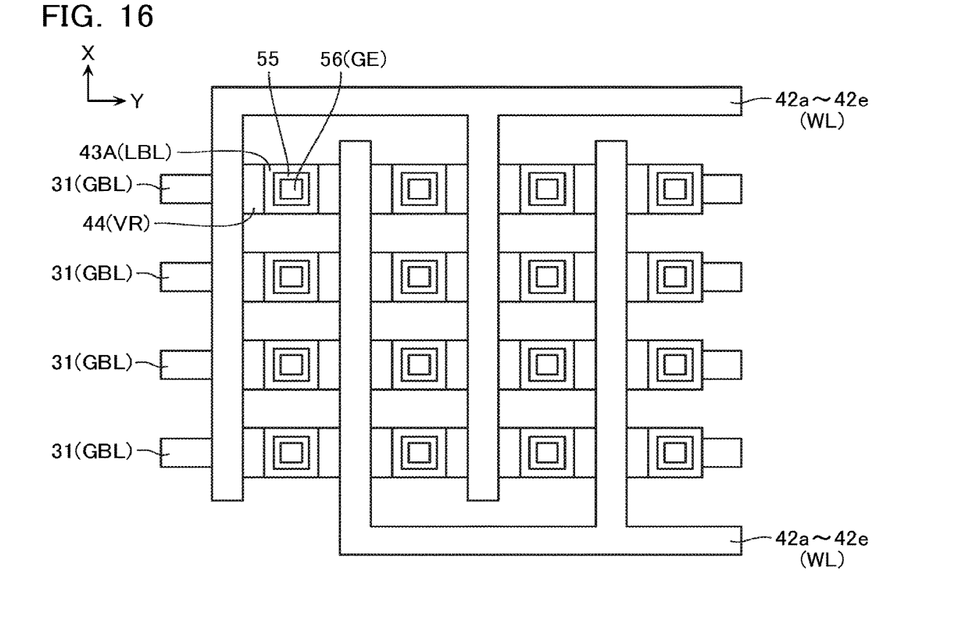
FIG. 16 is a cross-sectional view along line A-A' of FIG. 14.

Next, with reference to FIGS. 14, 15 and 16, the schematic configuration of the memory cell array of the second embodiment will be described. FIG. 14 is a perspective view showing an example of a laminated structure of the memory cell array 11. FIG. 15 is a schematic top view of an upper surface of the memory cell array 11 seen from the Z direction. FIG. 16 is a cross-sectional view of line A-A' of FIG. 14.

As shown in FIG. 14, the memory cell array 11 has a plurality of conductive layers 42a to 42e (word lines WL) that are laminated at a certain pitch in the Z direction perpendicular to the substrate 20, and that extends in the X direction parallel to a surface of the substrate 20. The conductive layers 42a to 42e are disposed in the Y direction orthogonal to the X direction, and are formed in comb shapes when seeing from the Z direction, as shown in FIGS. 15 and 16.

A variable resistive layer 44 (the variable resistive element VR) extending in the Z direction is disposed at side surfaces in the Y direction of the conductive layers 42a to 42e. The variable resistive layer 44 is configured by hafnium oxide (HfOx), for example, similar to the first embodiment. Although the variable resistive layer 44 is commonly disposed over the plurality of word lines WL in FIG. 15, the variable resistive layer 44 may be configured to be disposed separately for each of the word lines WL.

As shown in FIGS. 14, 15 and 16, a columnar semiconductor layer 43A (the local bit line LBL) having a columnar shape and extending in the Z direction, is disposed at a side surface of the variable resistive layer 44 opposite to the word line WL. That is, the columnar semiconductor layer 43A contacts the conductive layers 42a to 42e (the word lines WL) via the variable resistive layer 44. In addition, the columnar semiconductor layer 43A is disposed in a matrix in the X direction and the Y direction. A semiconductor that configures the columnar semiconductor layer 43A is an n-type semiconductor layer that is doped with impurities such as phosphorus (P) and arsenic (As) at at least a lower end thereof.

Since the semiconductor memory device according to this embodiment has the configuration described above, the memory cell MC including the variable resistive element VR is disposed at a portion (an intersection) where the word line WL and the local bit line LBL intersect. Therefore, the memory cells MC are disposed along the X, Y and Z directions, respectively, so as to configure a three dimensional matrix.

Note that, in this embodiment, a planar shape of the local bit line LBL is rectangular as shown in FIG. 15 and FIG. 16. Regarding a relationship between lengths of the X direction and the Y direction of this rectangle, one of the lengths can be longer than the other, or can be the same to the other. In addition, the planar shape of the local bit line LBL can be circular; the planar shape of the local bit line LBL is not limited to be rectangular.

In addition, as shown in FIG. 14, a conductive layer 31 that functions as the global bit line GBL is connected to a lower end in the Z direction of the local bit line LBL. The conductive layer 31 (the global bit line GBL) extends in the Y direction, and is arranged in the X direction at a certain pitch above the substrate 20. The conductive layer 31 is configured by metal such as tungsten (W), for example.

Moreover, as shown in FIG. 14 and FIG. 15, conductive layers 58 that extend in the X direction are arranged in the Y direction at a certain pitch above the conductive layer 42e (the word line WL) positioned at an uppermost layer of the conductive layers. The conductive layer 58 functions as the above-described gate line GL. Furthermore, as shown in FIG. 14 and FIG. 16, a conductive layer 56 (the gate electrode GE) extending in the Z direction is disposed inside of the columnar conductive layer 43A via a gate insulating film 55. That is, an inner surface of the local bit line LBL faces a side surface of the gate electrode GE via the gate insulating film 55. The conductive layer 56 that functions as the gate electrode GE may be configured by an n-type polysilicon with a high impurity concentration, or titanium nitride (TiN), and the like. An upper end of the gate electrode GE is electrically connected to the gate line GL.

Next, with reference to FIG. 17, the laminated structure of the memory cell array 11 according to the second embodiment will be described with a cross-sectional view.

Figure 17:
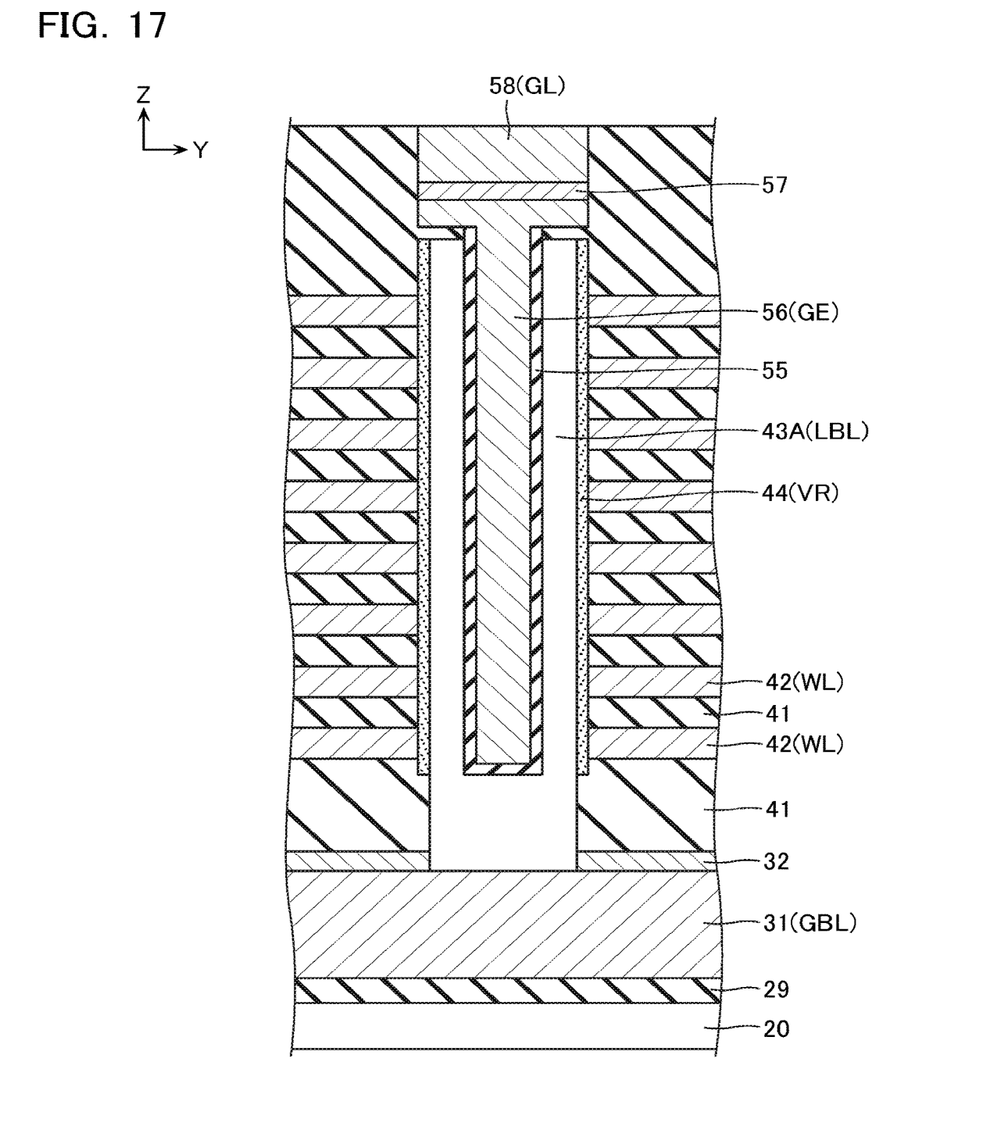
FIG. 17 is a cross-sectional view showing one columnar semiconductor layer 43A of the memory cell array 11 according to the second embodiment.

FIG. 17 is a schematic cross-sectional view showing a part including the plurality of memory cells MC of the memory cell array 11.

As shown in FIG. 17, in this embodiment, interlayer insulating layers 41 and the conductive layers 42 are alternately laminated in the Z direction above the substrate 20. The variable resistive layer 44 is commonly disposed at side surfaces positioned at the end of the Y direction of the conductive layers 42. Note that in the second embodiment, a lowermost layer conductive layer 42 may not function as the word line WL, and may be used as a so-called dummy word line. As described above, in the second embodiment, the select transistor STr does not exist between the lowermost layer word line WL and the global bit line GBL. In the equivalent circuit, the select transistors STr are connected in series between the local bit lines LBL (see FIG. 13). Note that, the interlayer insulating layer 41 may be formed from an insulating material such as silicon oxide (SiOx), for example. The conductive layer 42 functions as the word line WL. The conductive layer may be formed from the material described above used for the word line WL. The variable resistive layer 44 functions as the variable resistive element VR. The variable resistive layer 44 may be formed from the material described above used for the variable resistive element VR.

The columnar semiconductor layer 43A (the local bit line LBL) having the columnar shape and extending in the Z direction is disposed at the side surface of the variable resistive layer 44 opposite to the conductive layer 42. The conductive layer 56 (the gate line GE) is disposed along its center core inside of the columnar semiconductor layer 43A via the gate insulating film 55. The conductive layer 56 disposed along the center core does not penetrate the columnar semiconductor layer 43A to a lower end thereof. As a result, the columnar semiconductor layer 43A is formed in a U-shape when seeing in a YZ cross section.

The conductive layer 56 is connected to the conductive layer 58 (the gate line GL) via a barrier layer 57 at an upper end thereof. The conductive layer 58 extends in the X direction similar to the word line WL. The barrier layer 57 is configured by titanium silicide (TiSix), for example.

The lower end of the columnar semiconductor layer 43A is connected to the conductive layer 31 via a barrier layer 32. The conductive layer 31 is disposed above the substrate 20 via an insulating layer 29. The barrier layer 32 is configured by titanium nitride (TiN) and the like, and functions as barrier metal that prevents diffusing of impurities and the like to the conductive layer 31.

An impurity concentration distribution of an end portion of the columnar semiconductor layer 43A at the global bit line GBL side of this second embodiment can be set as similar to the columnar semiconductor layer 35 of the first embodiment.

The columnar semiconductor layer 43A (the local bit line LBL) configures a channel portion of the select transistor STr. The select transistor STr needs to flow a large on-current Ion when selected, and needs to suppress an off-current Ioff when not selected. When a difference of magnitude (a margin) between the on-current Ion and the off-current Ioff is small, accurately determining data of the memory cell MC becomes difficult. However, as described above, when applying a negative gate voltage to the non-selected select transistor STr via the gate line GL, the so-called GIDL (Gate Induced Drain Leakage) current is generated near the non-selected select transistor STr. Due to this, there is a problem that a leak characteristic of the non-selected select transistor STr (the columnar semiconductor layer 43A) deteriorates. Thereby, the difference between the on-current Ion that flows in the selected memory cell MC and the off-current Ioff that flows in the non-selected memory cell MC decreases. That makes it difficult to accurately read a stored data of the memory cell MC.

Therefore, in the semiconductor memory device of the embodiment, the impurity concentration distribution is set such that an impurity concentration $\rho$ of impurities (such as phosphorus) included in the columnar semiconductor layer 43A is set to high at the global bit line GBL side and decrease as approaching the bit line BL side. For example, the impurity concentration $\rho$ at the end portion of the columnar semiconductor layer 43A of the global bit line GBL side is set to a concentration that ohmic contact can be obtained, such as $5 \times 10^{19}$ [cm$^{-3}$] or more, for example. And, the impurity concentration $\rho$ at a position at least 30 nm far from the end portion to the bit line BL side is set to one hundredth of $5 \times 10^{19}$ [cm] or less. According to this, ohmic contact between the global bit line GBL and the columnar semiconductor layer 43A is maintained, and the GIDL current is effectively controlled, thus the leak characteristic can be favorably maintained.

More specifically, an impurity concentration $\rho(Z)$ of the columnar semiconductor layer 43A at a position that is at a distance Z from the end portion of the columnar semiconductor layer 43A of the global bit line GBL side is represented by the formulas (1) to (3), similar to the first embodiment. Here, $\rho o$ is the impurity concentration of the end portion of the columnar semiconductor layer 43A of the global bit line GBL side, and Zo is a Z-axis coordinate value of the end portion of the columnar semiconductor layer 43A of the global bit line GBL side, $x_j$ is the attenuation constant. $N_{BG}$ is the impurity concentration after attenuation of the columnar semiconductor layer 43A at the bit line BL side. Note that, because a change of an attenuation curve of the impurity concentration distribution and a change of the off current Ioff based on a change of the attenuation constant $x_j$ are approximately similar to the first embodiment, duplicate description is omitted.

As described above, in this second embodiment, the impurity concentration distribution of the columnar semiconductor layer 43A is set as described above. According to this, similar to the first embodiment, the on-current that flows in the selected memory cell can be increased, and the off-current that flows in the non-selected memory cell can be decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above embodiments, the variable resistive memory that transition metal oxides or rare earth element oxides are used as the variable resistive element is described as an example. This invention is not limited to this, a CBRAM (Conductive Bridging RAM) that metal atom itself is used as the variable resistive element or a PCRAM (Phase Change RAM) that a phase change element is used as the variable resistive element are also applied.

What is claimed is:

1. A semiconductor memory device, comprising:
   a first wiring extending in a first direction as a longitudinal direction thereof;
   a second wiring extending in a second direction as a longitudinal direction thereof, the second direction intersecting with the first direction;
   a memory cell disposed at an intersection portion of the first wiring and the second wiring, the memory cell including a variable resistive element;
   a select transistor having one end connected to the second wiring; and
   a third wiring connected to the other end of the select transistor,
   the select transistor including:
     a semiconductor layer including impurities therein, the semiconductor layer having a first end connected to the second wiring and a second end connected to the third wiring;
     a gate insulating film disposed on a side surface of the semiconductor layer; and
     a select gate line facing the semiconductor layer via the gate insulating film,
     the semiconductor layer having a first impurity concentration at the second end,
     an impurity concentration of the semiconductor layer decreasing to a second impurity concentration from the first impurity concentration as approaching to the first end from the second end, and an impurity concentration ρ of the semiconductor layer at a position that is away from the second end of the semiconductor layer by a distance Z is $$\rho = \max\left[\rho o \cdot \exp\left(-\frac{\log\left(\frac{\rho o}{N_{BG}}\right)^2 (Z-Zo)^2}{x_j^2}\right), N_{BG}\right],$$

where ρo is an impurity concentration of the second end, Zo is coordinates of the second end, $x_j$ is an attenuation constant, and $N_{BG}$ is an impurity concentration after attenuation of the semiconductor layer.

2. The semiconductor memory device according to claim 1, wherein the second impurity concentration is one hundredth or less of the first impurity concentration.

3. The semiconductor memory device according to claim 1, wherein the first impurity concentration is $5 \times 10^{19}$ [cm$^{-3}$] or more.

* * * * *